United States Patent
Lamont et al.

(10) Patent No.: US 11,338,405 B2
(45) Date of Patent: May 24, 2022

(54) ECO-INDICATOR FOR POWER TOOL

(71) Applicant: MILWAUKEE ELECTRIC TOOL CORPORATION, Brookfield, WI (US)

(72) Inventors: Lance D. Lamont, Brookfield, WI (US); Samantha L. Billetdeaux, New Berlin, WI (US); Timothy R. Obermann, Waukesha, WI (US); Joseph H. Ellice, Greenfield, WI (US); Amanda M. Kachar, West Allis, WI (US); Kathleen M. Keegan, Milwaukee, WI (US); Brian Alves, Milwaukee, WI (US); Toby Lichtensteiger, Port Washington, WI (US); Mitchell Carlson, Lisbon, WI (US); Colin J. Harper, Greenfield, WI (US)

(73) Assignee: MILWAUKEE ELECTRIC TOOL CORPORATION, Brookfield, WI (US)

( * ) Notice: Subject to any disclaimer, the term of this patent is extended or adjusted under 35 U.S.C. 154(b) by 562 days.

(21) Appl. No.: 16/272,182

(22) Filed: Feb. 11, 2019

(65) Prior Publication Data

US 2019/0262960 A1   Aug. 29, 2019

Related U.S. Application Data

(60) Provisional application No. 62/636,630, filed on Feb. 28, 2018.

(51) Int. Cl.
  *B23Q 17/09*   (2006.01)
  *F21V 33/00*   (2006.01)
  (Continued)

(52) U.S. Cl.
  CPC ...... *B23Q 17/0961* (2013.01); *F21V 33/0084* (2013.01); *G01R 31/3644* (2013.01);
  (Continued)

(58) Field of Classification Search
  CPC ............ B23Q 17/0961; F21V 33/0084; G01R 31/3644; G08B 5/00; G08B 5/36; B25F 5/00; Y02E 60/10
  See application file for complete search history.

(56) References Cited

U.S. PATENT DOCUMENTS

| 4,550,277 A | 10/1985 | Carney |
| 4,574,226 A | 3/1986 | Binder |

(Continued)

FOREIGN PATENT DOCUMENTS

| CN | 105215953 A | 1/2016 |
| ES | 1076369 U | 2/2012 |

(Continued)

OTHER PUBLICATIONS

Chinese Patent Office Action for Application No. 201990000527.0 dated Apr. 7, 2021 (3 pages including statement of relevance).

(Continued)

*Primary Examiner* — Orlando Bousono
(74) *Attorney, Agent, or Firm* — Michael Best & Friedrich LLP

(57) ABSTRACT

A power tool includes a battery pack, one or more sensors, an indicator, and an electronic processor coupled to the battery pack, the one or more sensors, and the indicator. The electronic processor is configured to: detect, using the one or more sensors, one or more parameters of the power tool; determine a system performance based on the one or more parameters; determine a system performance level based on the system performance; and provide, using the indicator, an indication corresponding to the system performance.

28 Claims, 7 Drawing Sheets

(51) Int. Cl.
*G08B 5/36* (2006.01)
*G01R 31/36* (2020.01)
*G08B 5/00* (2006.01)
*B25F 5/00* (2006.01)

(52) U.S. Cl.
CPC .............. *G08B 5/00* (2013.01); *G08B 5/36* (2013.01); *B25F 5/00* (2013.01)

(56) References Cited

U.S. PATENT DOCUMENTS

| | | | |
|---|---|---|---|
| 5,014,793 | A | 5/1991 | Germanton et al. |
| 5,410,229 | A | 4/1995 | Sebastian et al. |
| 5,889,922 | A | 3/1999 | Bufe et al. |
| 5,923,145 | A | 7/1999 | Reichard et al. |
| 6,172,860 | B1 | 1/2001 | Yoshimizu et al. |
| 6,479,958 | B1 | 11/2002 | Thompson et al. |
| 6,495,932 | B1 | 12/2002 | Yoshimizu et al. |
| 6,771,043 | B2 | 8/2004 | Matsunaga et al. |
| 6,873,124 | B2 | 3/2005 | Kawano et al. |
| 6,945,330 | B2 | 9/2005 | Wilson et al. |
| 7,109,675 | B2 | 9/2006 | Matsunaga et al. |
| 7,133,601 | B2 | 11/2006 | Phillips et al. |
| 7,152,680 | B2 | 12/2006 | Wilson et al. |
| 7,446,493 | B2 | 11/2008 | Forster et al. |
| 7,496,460 | B2 | 2/2009 | Hornick et al. |
| 7,504,791 | B2 | 3/2009 | Sieber et al. |
| 7,521,892 | B2 | 4/2009 | Funabashi et al. |
| 7,551,411 | B2 | 6/2009 | Woods et al. |
| 7,580,803 | B2 | 8/2009 | Hornick et al. |
| 7,681,659 | B2 | 3/2010 | Zhang et al. |
| 7,817,384 | B2 | 10/2010 | Woods et al. |
| 8,172,004 | B2 | 5/2012 | Ho |
| 8,302,701 | B2 | 11/2012 | Morimura et al. |
| 8,505,647 | B2 | 8/2013 | Kasuya et al. |
| 8,657,031 | B2 | 2/2014 | Kononenko et al. |
| 8,672,807 | B2 | 3/2014 | Atsumi et al. |
| 8,803,481 | B2 | 8/2014 | Tachikawa et al. |
| 8,881,842 | B2 | 11/2014 | Borinato et al. |
| 8,919,456 | B2 | 12/2014 | Ng et al. |
| 9,162,331 | B2 | 10/2015 | Tang |
| 9,193,055 | B2 | 11/2015 | Lim et al. |
| 9,257,925 | B2 | 2/2016 | Coates |
| 9,314,855 | B2 | 4/2016 | Ookubo et al. |
| 9,325,265 | B2 | 4/2016 | Suzuki |
| 9,352,456 | B2 | 5/2016 | Murthy et al. |
| 9,537,335 | B2 | 1/2017 | Furui et al. |
| 9,543,871 | B2 | 1/2017 | Kato |
| 9,577,450 | B2 | 2/2017 | Yoshikawa et al. |
| 9,595,839 | B2 | 3/2017 | Furui et al. |
| 9,780,583 | B2 | 10/2017 | Furui et al. |
| 9,780,718 | B2 | 10/2017 | Barfus et al. |
| 2007/0000676 | A1 | 1/2007 | Arimura |
| 2007/0084613 | A1 | 4/2007 | Zhang et al. |
| 2008/0110653 | A1 | 5/2008 | Zhang et al. |
| 2011/0030981 | A1 | 2/2011 | Furui et al. |
| 2012/0019177 | A1 | 1/2012 | Kaufinann et al. |
| 2012/0163932 | A1* | 6/2012 | Schmidt .................. B25F 5/021 408/1 R |
| 2013/0020102 | A1 | 1/2013 | Björnlinger et al. |
| 2013/0098646 | A1 | 4/2013 | Funabashi et al. |
| 2013/0327552 | A1 | 12/2013 | Lovelass et al. |
| 2014/0148808 | A1* | 5/2014 | Inkpen .................. A61B 17/15 606/80 |
| 2014/0151079 | A1 | 6/2014 | Furui et al. |
| 2014/0158389 | A1 | 6/2014 | Ito et al. |
| 2014/0284070 | A1* | 9/2014 | Ng .............. B25F 5/02 173/2 |
| 2014/0352995 | A1 | 12/2014 | Matsunaga et al. |
| 2014/0371761 | A1* | 12/2014 | Juanpera .................. B25J 7/00 606/130 |
| 2015/0041164 | A1* | 2/2015 | Sergyeyenko ........ B25B 23/147 173/1 |
| 2015/0352699 | A1 | 12/2015 | Sakai et al. |
| 2016/0031072 | A1 | 2/2016 | Lim et al. |
| 2017/0008159 | A1 | 1/2017 | Boeck et al. |
| 2017/0106520 | A1 | 4/2017 | Schadow et al. |
| 2017/0216986 | A1 | 8/2017 | Dey, IV et al. |
| 2017/0222579 | A1 | 8/2017 | Wang et al. |
| 2018/0323641 | A1* | 11/2018 | Lee .................. H02J 9/061 |
| 2020/0052479 | A1 | 2/2020 | Friedman et al. |
| 2020/0086405 | A1* | 3/2020 | Ogino .................. B25F 5/00 |

FOREIGN PATENT DOCUMENTS

| | | |
|---|---|---|
| GB | 2485276 A | 5/2012 |
| WO | 2017174300 A1 | 10/2017 |

OTHER PUBLICATIONS

International Search Report and Written Opinion for Application No. PCT/US2019/019217, dated Jun. 14, 2019, 12 pages.
International Search Report and Written Opinion for Application No. PCT/US2019/017443, dated Jun. 27, 2019, 14 pages.

* cited by examiner

ECO-INDICATOR FOR POWER TOOL

CROSS-REFERENCE TO RELATED APPLICATIONS

This application claims priority U.S. Provisional Patent Application No. 62/636,630 filed on Feb. 28, 2018, the entire contents of which are incorporated herein by reference.

FIELD OF THE INVENTION

The present invention relates to power tools, and more particularly to indicators for use with power tools.

BACKGROUND OF THE INVENTION

Electrical motors in battery-powered power tools, such as rotary power tools, draw current from a battery pack in proportion to the applied force on the tool against a workpiece. Variability in the applied force will vary the load on the motor and thus the amount of current drawn by the motor.

SUMMARY OF THE INVENTION

User perception of the operation of high-voltage battery-powered power tools is different compared to typical 12V or 18V power tools. The operator may not realize the amount of current being drawn from the battery pack. This may result in inefficient operation of the power tool leading to faster than normal discharge of the battery pack or slower completion of a workpiece operation.

The present invention provides, in one aspect, a battery-powered power tool including an electric motor and an indicator for communicating power consumption of the electric motor to a user while the tool is in use to allow the user to adjust how the tool is being used to reduce power consumption of the battery or to speed-up completion of a workpiece operation.

The present invention provides, in another aspect, a power tool including a battery pack, one or more sensors, an indicator, and an electronic processor coupled to the battery pack, the one or more sensors, and the indicator. The electronic processor is configured to: detect, using the one or more sensors, one or more parameters of the power tool; determine a system performance based on the one or more parameters; determine a system performance level based on the system performance; and provide, using the indicator, an indication corresponding to the system performance.

The present invention provides, in one aspect, a battery-powered power tool including an electric motor, an electronic processor, a current sensor, and an indicator. The electronic processor is configured to detect, using the current sensor, a motor current and determine a current level based on the motor current. The electronic processor is further configured to provide, using the indicator, an indication corresponding to the current level.

In one instance, the electronic processor is further configured to determine that the motor current exceeds a maximum allowable current value and simulate a bog-down of the electric motor in response to determining that the motor current exceeds the maximum allowable current value.

The present invention provides, in yet another aspect, a method for providing a performance indication of a battery-powered power tool. The method includes detecting, using an electronic processor with a current sensor, a motor current and determining, using the electronic processor, a current level based on the motor current. The method further includes providing, using the electronic processor with an indicator, an indication corresponding to the current level.

In one instance, the method further includes determining, using the electronic processor, that the motor current exceeds a maximum allowable current value and simulating, using the electronic processor, a bog-down of the electric motor in response to determining that the motor current exceeds the maximum allowable current value.

The present invention provides, in a further aspect, a battery-powered power tool including an electric motor, an electronic processor, one or more sensors, and an indicator. The electronic processor is configured to detect, using the one or more sensors, one or more parameters of the power tool and determine a system performance based on the one or more parameters. The electronic processor is further configured to determine a system performance level based on the system performance and provide, using the indicator, an indication corresponding to the system performance level.

In one instance, the electronic processor is further configured to determine that the system performance exceeds a maximum allowable system performance and simulate a bog-down of the electric motor in response to determining that the system performance exceeds the maximum allowable system performance The present invention provides, in another aspect, a method for indicating performance of a power tool. The method includes detecting, using an electronic processor with one or more sensors, one or more parameters of the power tool and determining, using the electronic processor, a system performance based on the one or more parameters. The method further includes determining, using the electronic processor, a system performance level based on the system performance and providing, using the electronic processor with an indicator, an indication corresponding to the system performance level.

In one instance, the method further includes determining, using the electronic processor, that the system performance exceeds a maximum allowable system performance and simulating, using the electronic processor, a bog-down of the electric motor in response to determining that the system performance exceeds the maximum allowable system performance.

The present invention provides, in another aspect, a method for providing a performance indication of a battery-powered power tool. The method includes detecting, using an electronic processor with one or more sensors, one or more parameters of the power tool and determining, using the electronic processor, a system performance based on the one or more parameters. The method further includes determining, using the electronic processor, a system performance level based on the system performance and providing, using the electronic processor with an indicator, an indication corresponding to the current level. The method also includes determining that the system performance satisfies a maximum system performance threshold and simulating bog-down of a motor of the power tool in response to determining that the system performance exceeds the maximum system performance threshold. Simulating bog-down of the motor includes reducing the speed of the motor to a non-zero value The present invention provides, in one aspect, a battery-powered power tool including an indicator for communicating power consumption of the tool to a user while the tool is in use to allow the user to adjust how the tool is being used to reduce power consumption of the battery or to faster completion of an application.

The present invention provides, in one aspect, a battery-powered power tool including an electronic processor, a current sensor, and an indicator. The electronic processor is configured to detect, using the current sensor, a tool current and determine a current level based on the tool current. The electronic processor is further configured to provide, using the indicator, an indication corresponding to the current level.

The present invention provides, in yet another aspect, a method for providing a performance indication of a battery-powered power tool. The method includes detecting, using an electronic processor with a current sensor, a tool current and determining, using the electronic processor, a current level based on the tool current. The method further includes providing, using the electronic processor with an indicator, an indication corresponding to the current level.

The present invention provides, in a further aspect, a battery-powered power tool including an electronic processor, one or more sensors, and an indicator. The electronic processor is configured to detect, using the one or more sensors, one or more parameters of the power tool and determine a system performance based on the one or more parameters. The electronic processor is further configured to determine a system performance level based on the system performance and provide, using the indicator, an indication corresponding to the system performance level.

The present invention provides, in yet another aspect,

Other features and aspects of the invention will become apparent by consideration of the following detailed description and accompanying drawings.

Figure 1:
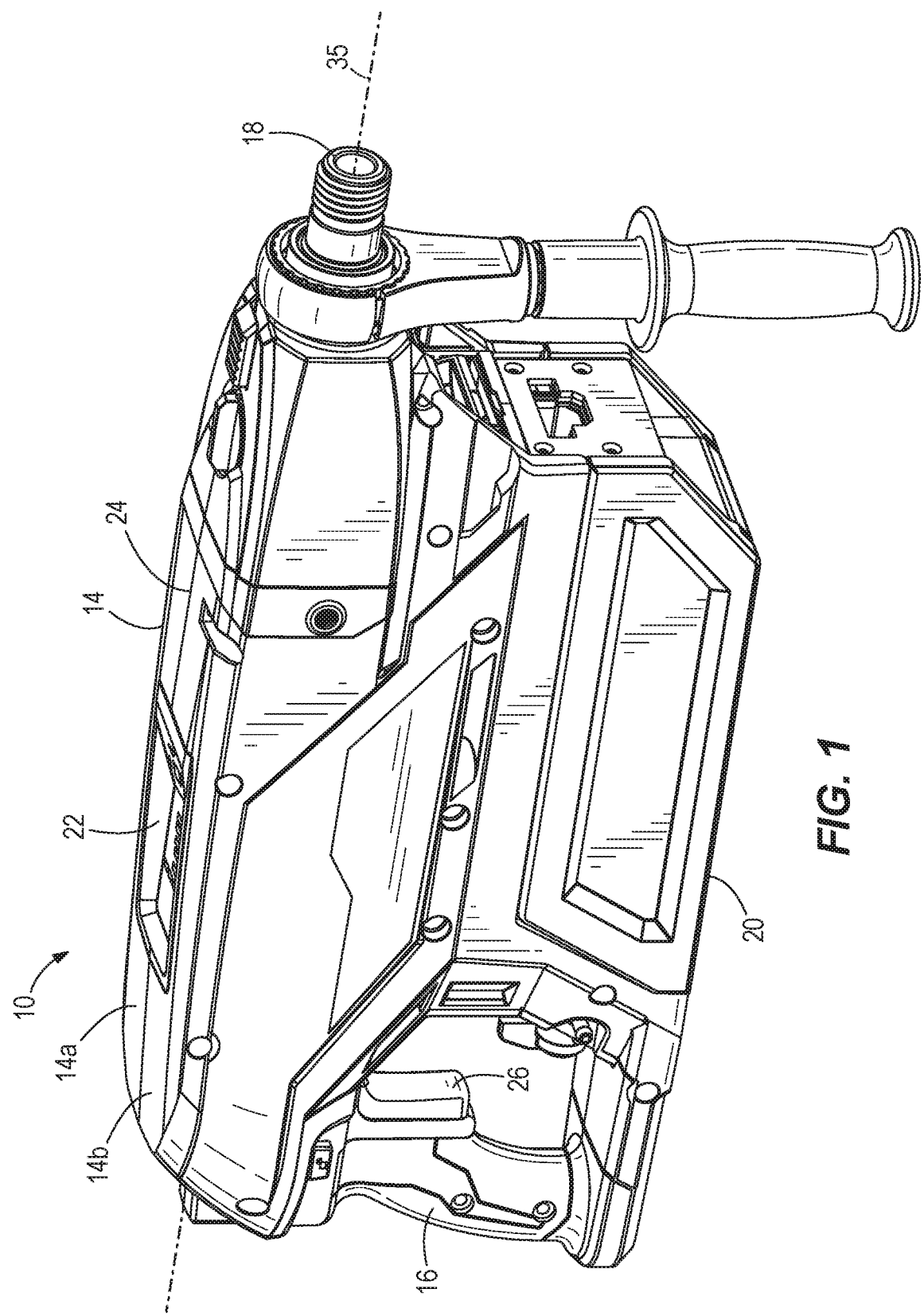
FIG. 1 is a perspective view of a power tool in accordance with an embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting.

DETAILED DESCRIPTION

It should be noted that a plurality of hardware and software based devices, as well as a plurality of different structural components may be utilized to implement the invention. Furthermore, and as described in subsequent paragraphs, the specific configurations illustrated in the drawings are intended to exemplify embodiments of the invention and that other alternative configurations are possible. The terms "processor" "central processing unit" and "CPU" are interchangeable unless otherwise stated. Where the terms "processor" or "central processing unit" or "CPU" are used as identifying a unit performing specific functions, it should be understood that, unless otherwise stated, those functions can be carried out by a single processor, or multiple processors arranged in any form, including parallel processors, serial processors, tandem processors or cloud processing/cloud computing configurations.

FIG. 1 illustrates a power tool, which is a core drill 10 in the illustrated embodiment. In other embodiments, the power tool is another type of power tool, such as a concrete saw, a breaker or jack hammer, a work light or the like. The illustrated core drill 10 includes a housing 14, a handle 16, an output shaft 18, a battery pack 20, and a user interface 22. The illustrated housing 14 is a clamshell housing having left and right cooperating halves 14a, 14b and includes a motor housing portion 24. An electric motor 68 (FIG. 4) is mounted in the motor housing portion 24. The illustrated core drill 10 is cordless and includes the battery pack 20 as a power source that provides power to the motor. The battery pack 20 is removably coupled to a battery receptacle of the housing 14, which is located underneath the motor housing portion 24 in the illustrated embodiment (FIG. 1). The battery pack 20 may provide a nominal voltage of about 80 volts DC, or another level between about 60-90 volts. The battery pack 20 may include several battery cells electrically connected in series, parallel, or a combination thereof, to generate the desired output voltage. The battery cells may be of any chemistry, for example, Lithium-ion, Nickel-Cadmium, or the like. The battery pack 20 may further include a microprocessor used to control, at least in part, charging and discharging of the battery pack 20, and operable to communicate with the core drill 10. With the battery pack 20 removed, the core drill 10 is also capable of being powered by an AC power source via an electrical cord. When operating in this manner, an AC adapter is required to convert the AC power to DC power, which is then provided to the core drill 10 via an electrical cord and a plug received in the battery pack receptacle in the same manner as the battery pack 20.

The motor 68 drives the output shaft 18, to which a core bit is attachable. The motor 68 is energized based on the position of a trigger 26. In some embodiments, the trigger 26 is located on the handle 14. When the trigger 26 is actuated (i.e., depressed such that it is held close to the handle 14), power is provided to the motor 68 to cause the output shaft 18 to rotate. When the trigger 26 is released as shown in FIG. 1, the motor 68 remains deactivated.

Figure 2:
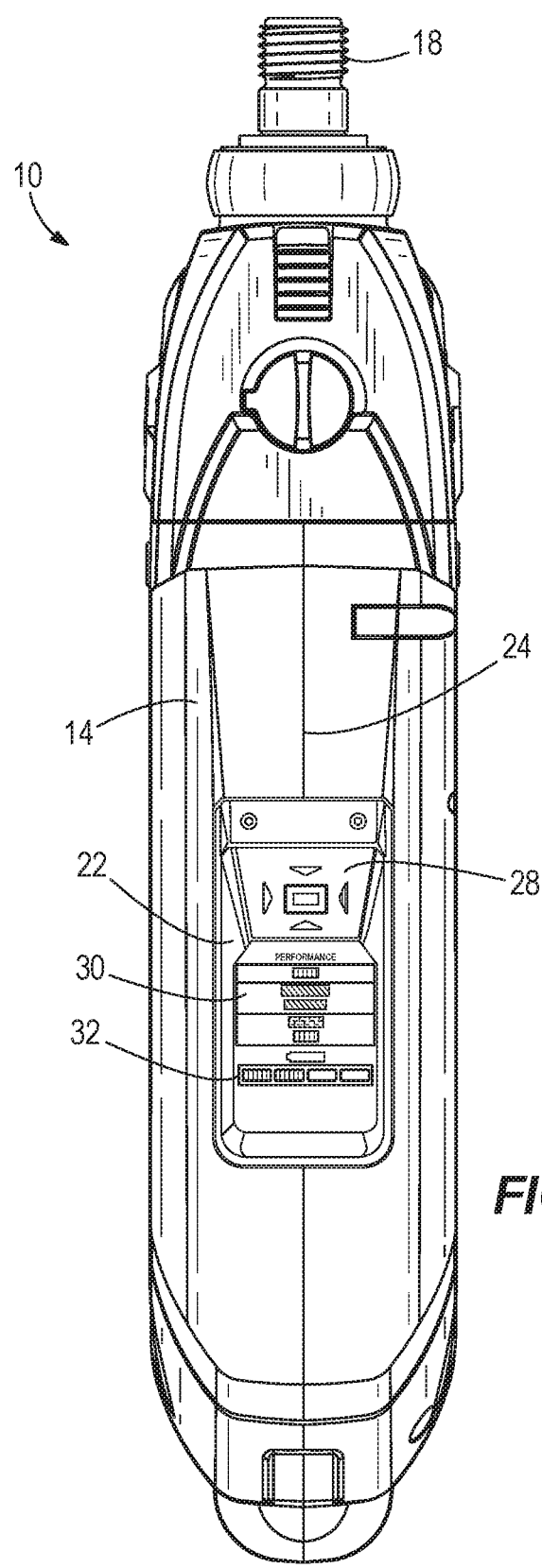
FIG. 2 is a top view of the power tool of FIG. 1.
Figure 3:
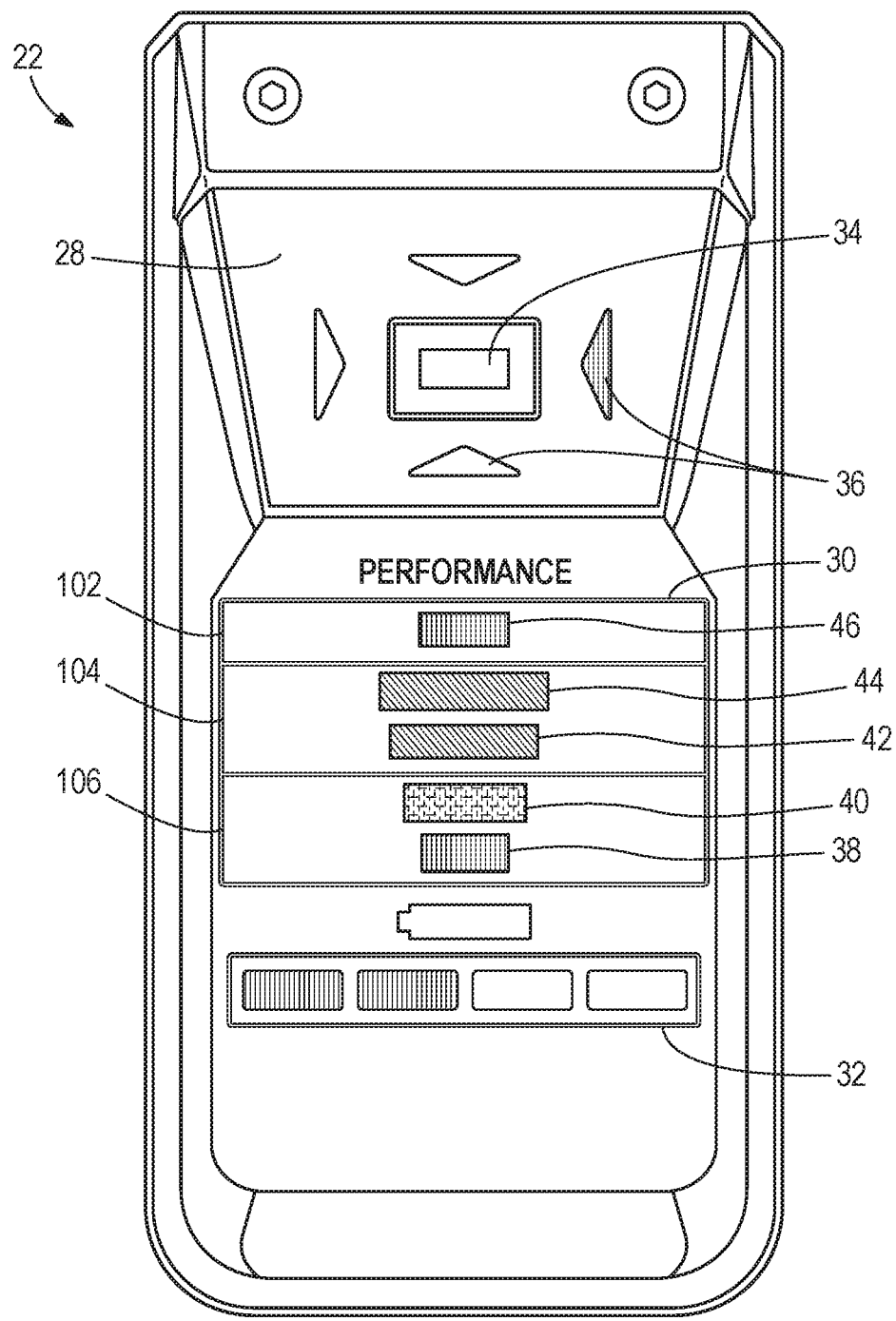
FIG. 3 is a plan view of a user interface of the power tool of FIG. 1.

Referring to FIG. 2, the user interface 22 is provided on a top portion of the housing 14 such that it is easily viewable by the operator while operating the core drill 10. And, the user interface 22 may be angled towards the operator, that is, towards the rear of the core drill 10, to further facilitate viewing by the operator. Referring also to FIG. 3, the user interface 22 includes a level indicator 28, an eco-indicator 30, and a battery meter 32.

The level indicator 28 includes a center indicator 34 and direction indicators 36. In the example illustrated, the center indicator 34 is bar shaped and indicates whether the core drill 10 is level. That is, the center indicator 34 indicates whether a rotational axis 35 of the output shaft 18 is either parallel with the ground (i.e., horizontal, when the core drill 10 is used in a sideways orientation) or perpendicular to the ground (i.e., vertical, when the core drill 10 is used in an upright orientation). The center indicator 34 may be illuminated to indicate to a user that the rotational axis 35 is horizontal or vertical relative to the ground. The direction indicators 36 include four indicators, one on each side of the center indicator 34. The direction indicators 36 are shaped like arrows that point towards the center indicator 34. The direction indicators 36 help the user in determining which direction to tilt or move the core drill 10 to align the rotational axis 35 either parallel with or perpendicular to the ground. For example, the right direction indicator 36 with the arrow pointing to the left may be illuminated when the core drill 10 is to be tilted or moved to the left.

Referring to FIG. 3, the eco-indicator 30 is provided on the user interface 22 to indicate an amount of power being used by the core drill 10 during operation (i.e., an amount of current being drawn from the battery pack 20). In the example illustrated, the eco-indicator 30 includes five LED bars 38, 40, 42, 44, and 46. The LED bars 38, 40, 42, 44, and 46 are distributed in a performance map that is segmented into a plurality of performance regions 102, 104, and 106 for operating the core drill 10. Illumination of the LED bars 38, 40, 42, 44, and 46 is described in detail below. Referring to FIG. 3, the battery meter 32 includes LED bars (for example, four LED bars 48, 50, 52, and 54) that are illuminated to indicate a state of charge of the battery pack 20.

Figure 4:
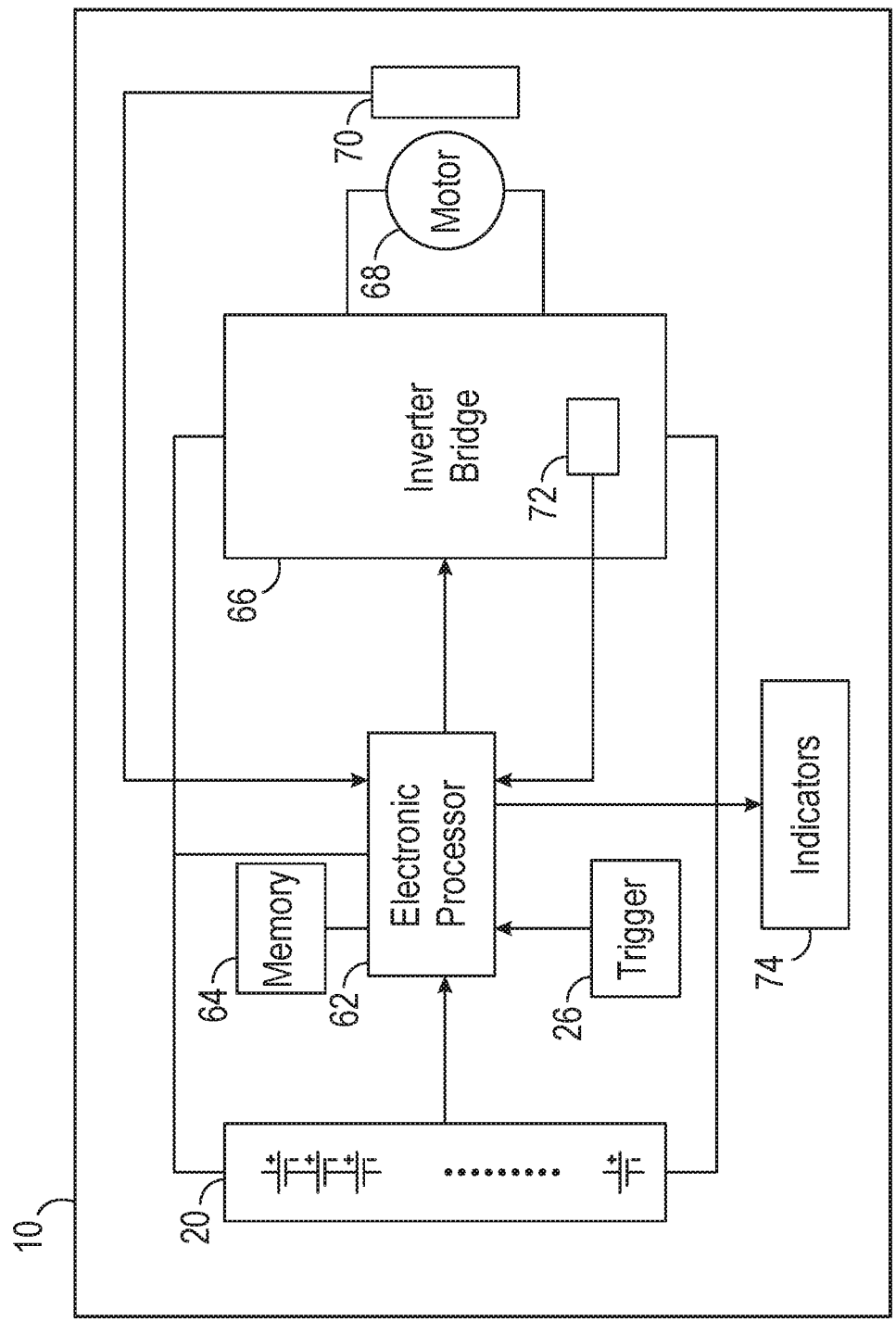
FIG. 4 is a block diagram of the power tool of FIG. 1.

FIG. 4 is a simplified block diagram of the core drill 10 according to one example embodiment. In the example illustrated, the core drill 10 includes an electronic processor 62, a memory 64, the battery pack 20, an inverter bridge 66, the motor 68, a rotational speed sensor 70, a current sensor 72, the trigger 26, and indicators 74.

The memory 64 stores instructions executed by the electronic processor 62 to carry out the functions of the core drill 10 described herein. In some embodiments, the electronic processor 62 may be implemented as a microprocessor with a separate memory (for example, memory 64). In other embodiments, the electronic processor 62 may be implemented as a microcontroller (with memory 64 on the same chip). In other embodiments, the electronic processor 62 may be implemented using multiple processors. In addition, the electronic processor 62 may be implemented partially or entirely as, for example, a field programmable gate array (FPGA), an application specific integrated circuit (ASIC), etc., and the memory 64 may not be needed or modified accordingly.

The inverter bridge 66 includes a plurality of field effect transistors (FETs) that are used to control the power supply to the motor 68. The electronic processor 62 provides pulse width modulated (PWM) signals to control the FETs of the inverter bridge 66 based on user input. Thereby, the electronic processor 62 may increase or decrease the speed of the motor 68 by increasing or decreasing the duty cycle of the PWM signals.

The rotational speed sensor 70 is provided near or attached to the motor 68 to detect the rotational speed of the motor 68. In some embodiments, the rotational speed sensor 70 may be a Hall-effect sensor that detects an angular position or angular speed of the permanent magnets of the motor 68. The current sensor 72 may be, for example, a current sense resistor that provides an indication, to the electronic processor 62, of an amount of current flowing to the motor 68. In some embodiments, the electronic processor 62 communicates with a battery pack controller (not shown) to receive information regarding the battery pack 20.

For example, the electronic processor 62 may receive instantaneous or average values of the battery pack voltage from the battery pack controller.

The indicators 74 receive control signals from the electronic processor 62 to turn on and off or otherwise convey information based on different states of the core drill 10. The indicators 74 include, for example, the individual LED bars or arrows of the level indicator 28, the eco-indicator 30, and the battery meter 32. The indicators 74 may also convey information to a user through audible or tactile outputs.

Figure 5:
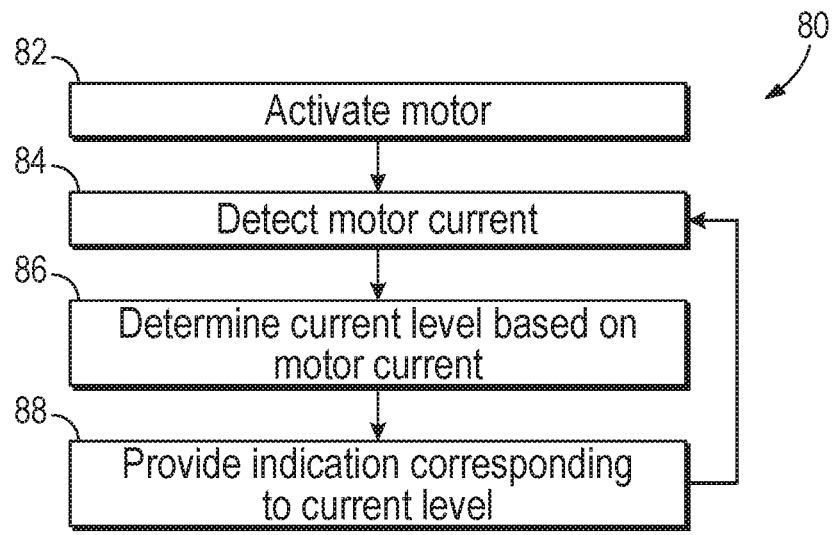
FIG. 5 is a flowchart of a method for providing performance indication of the power tool of FIG. 1.

FIG. 5 is a flowchart illustrating one example method 80 for providing performance indication of the core drill 10. In the example illustrated, the method 80 includes activating, using the electronic processor 62, the motor 68 (at block 82). The motor 68 may be activated in response to the user depressing the trigger 26 of the core drill 10, which prompts the electronic processor 62 to control the inverter bridge 66 to provide power to the motor 68.

The method 80 also includes detecting, using the electronic processor 62 with the current sensor 72, a motor current (at block 84). The method 80 further includes determining, using the electronic processor 62, a current level based on the motor current (at block 86). The electronic processor 62 compares the detected motor current to a range of motor current thresholds to determine the current level. In one example, the motor current thresholds are 20%, 40%, 60%, 80%, and 100% of maximum allowable motor current. The maximum allowable motor current may be a maximum current that the battery pack 20 can discharge without damaging the battery pack 20 or the core drill 10. This maximum battery current may be picked as the maximum allowable motor current.

In some embodiments, the amount of expected motor current may vary based on the voltage of the battery pack 20. In these embodiments, the electronic processor 62 may use a battery pack voltage measurement to weight the measured current values. For example, when the battery pack 20 has a first, higher voltage (e.g., when fully charged), the expected motor current may be higher than when the battery pack 20 has a second, lower voltage (e.g., after the battery pack 20 is partially drained through usage of the core drill 10). Accordingly, the electronic processor 62 may determine the battery pack voltage in block 84, and weight the detected current by multiplying the detected current by a value inversely proportional to the voltage of the battery pack 20. Thus, in some embodiments, the detected motor current in block 84 is an adjusted current weighted based on the voltage of the battery pack 20. Alternatively, in another embodiment, the voltage of the battery pack 20 is used to adjust the motor current thresholds. For example, the motor current thresholds are multiplied by a value inversely proportional to the voltage of the battery pack 20. In the foregoing description, the term "motor current" is used to describe both the detected motor current and the adjusted motor current. Similarly, the term "motor current thresholds" is used to describe both the motor current thresholds and the adjusted motor current thresholds.

As described above, the electronic processor 62 determines the current level by comparing the motor current to the motor current thresholds. For example, when the motor current is below the 20% motor current threshold, the electronic processor 62 determines that the motor current is at "current level 1." When the motor current is above the 20% motor current threshold but below the 40% motor current threshold, the electronic processor 62 determines that the motor current is at "current level 2." Similarly, motor current between 40% and 60% motor current thresholds corresponds to "current level 3," motor current between 60% and 80% motor current thresholds corresponds to "current level 4," motor current between 80% and 90% motor current thresholds corresponds to "current level 5," motor current between 90% and 100% motor current thresholds corresponds to "current level 6," and motor current above 100% motor current threshold corresponds to "current level 7." In some embodiments, other linear or non-linear thresholds are used for the current levels and may include additional or fewer current levels than provided above.

Figure 7:
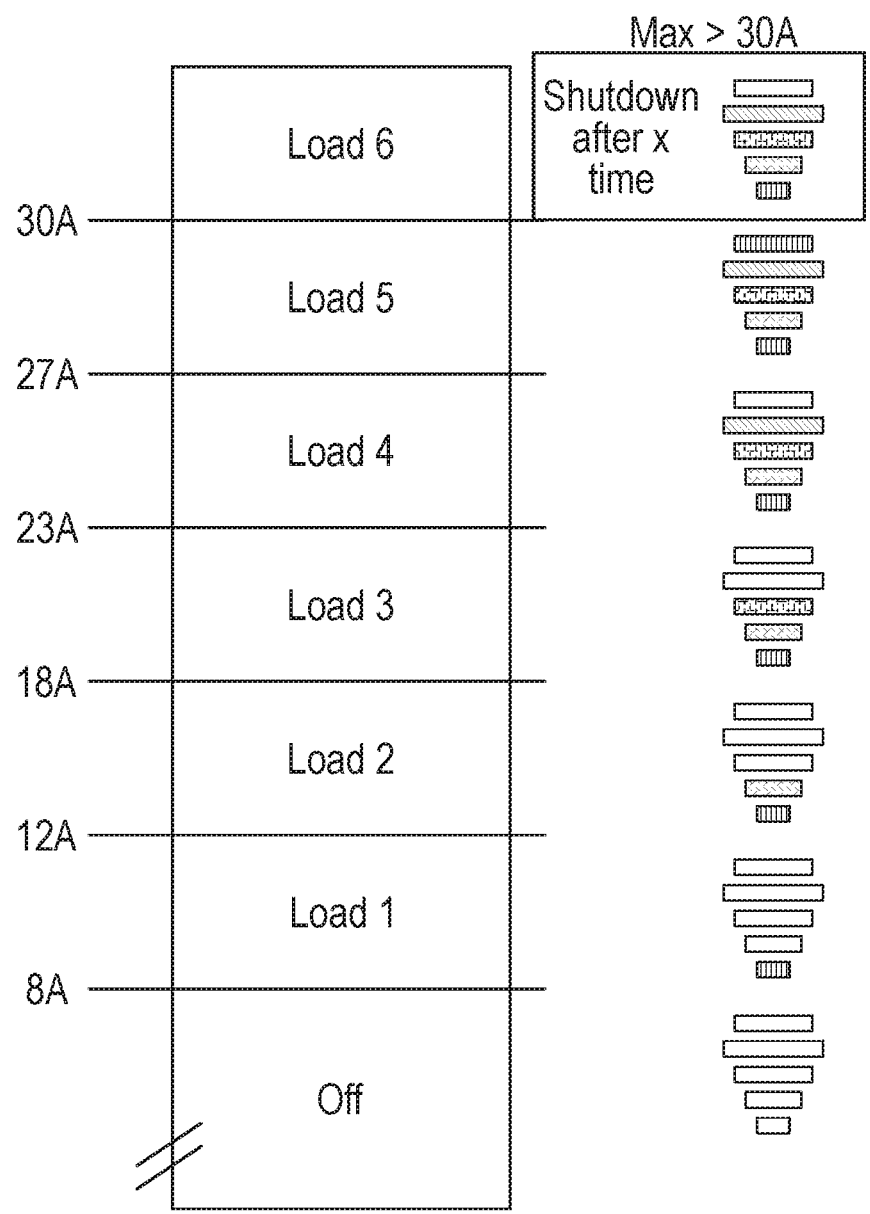
FIG. 7 is a diagram illustrating a lighting sequence of an eco-indicator of FIG. 3.

The method 80 also includes providing, with the electronic processor 62 and the eco-indicator 30, an indication corresponding to the current level (at block 88). In one embodiment, a look-up table may be stored in the memory 64 that maps the current level to indication. For example, "current level 1" corresponds to all LED bars 38, 40, 42, 44, and 46 being turned OFF. "Current level 2" corresponds to LED bar 38 being turned ON, while the LED bars 40, 42, 44, and 46 are turned OFF. Similarly, "current levels 3-6" correspond to progressively turning ON LED bars 38, 40, 42, 44, and 46 in sequence. "Current level 7" corresponds to the LED bars 38, 40, 42, 44, and 46 blinking to indicate to the user that the core drill 10 is operating above a maximum current level and will shut down after a predetermined amount of time. FIG. 7 illustrates a lighting sequence of the LED bars 38, 40, 42, 44, and 46 as described above with respect to method 80. The electronic processor 62 provides control signals to the LED bars 38, 40, 42, 44, and 46 based on the indication corresponding to the current level. After providing the indication, the method 80 returns to detecting the next instance of motor current and repeats the block 84, 86, and 88 until an input is detected to deactivate the motor 68 (e.g., releasing the trigger 26).

Figure 6:
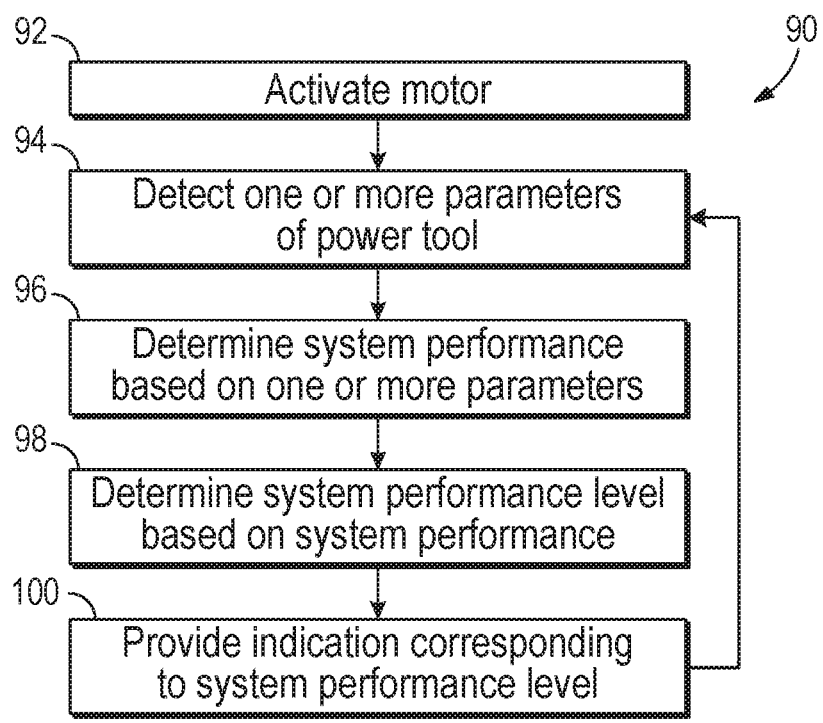
FIG. 6 is a flowchart of a method for providing performance indication of the power tool of FIG. 1.

FIG. 6 is a flowchart illustrating one example method 90 for providing performance indication of the core drill 10. In the example illustrated, the method 90 includes activating, using the electronic processor 62, the motor 68 (at block 92). As described above, the motor 68 may be activated in response to the user depressing the trigger 26 of the core drill 10, which prompts the electronic processor 62 to control the inverter bridge 66 to provide power to the motor 68.

The method 90 also includes detecting, using the electronic processor 62 with one or more sensors, one or more parameters of at least one of the battery pack 20 and the core drill 10 (at block 94). For example, the electronic processor 62 may communicate with a microprocessor of the battery pack 20 to determine a state of charge, temperature, and the like of the battery pack 20. Additionally, the electronic processor 62 may detect a temperature, pressure, and the like of the core drill 10 using, for example, a temperature sensor, a pressure sensor, and the like. The method 90 further includes determining a system performance based on the one or more parameters (at block 96). The electronic processor 62 may use known techniques to determine system performance by providing different weights to the one or more parameters and combining the weighted parameters. System performance may be modeled after industry standard benchmarks that combine the one or more parameters detected to predict the life of the core drill 10.

The method 90 further includes determining, using the electronic processor 62, a system performance level based on the system performance (at block 98). The electronic processor 62 compares the system performance to a range of system performance thresholds to determine the system performance level. In one example, the system performance thresholds are 20%, 40%, 60%, 80%, and 100% of maximum allowable system performance. The maximum allowable system performance may be a maximum value of weighted parameters that the core drill 10 can operate at without damaging the battery pack 20 or the core drill 10. The manufacturer may provide a maximum system performance that allows for safe operation. This maximum safe system performance may be picked as the maximum allowable system performance. In another example, the maximum allowable system performance may be a user-defined system performance level. The user may provide an input to the core drill 10 defining the system performance level. In response to the user input, the core drill 10 stores the user-defined system performance level as the maximum allowable system performance.

As described above, the electronic processor 62 determines the system performance level by comparing the motor current to the motor current thresholds. For example, when the system performance is below the 20% system performance threshold (that is, the system performance does not satisfy a first system performance threshold), the electronic processor 62 determines that the system performance is at "performance level 1." When the system performance is above the 20% system performance threshold but below the 40% system performance threshold (that is, the system performance satisfies the first system performance threshold and does not satisfy a second system performance threshold), the electronic processor 62 determines that the motor current is at "performance level 2." Similarly, system performance between 40% and 60% system performance thresholds corresponds to "performance level 3," system performance between 60% and 80% system performance thresholds corresponds to "performance level 4," system performance between 80% and 90% system performance thresholds corresponds to "performance level 5," system performance between 90% and 100% system performance thresholds corresponds to "performance level 6," and system performance above 100% system performance threshold corresponds to "performance level 7." In some embodiments, other linear or non-linear thresholds are used for the system performance levels and may include additional or fewer system performance levels than provided above. Additionally, the system performance levels may be defined by a user of the core drill 10. For example, the user may provide inputs to the core drill 10 defining the various system performances that correspond to the system performance levels as described above.

Figure 8:
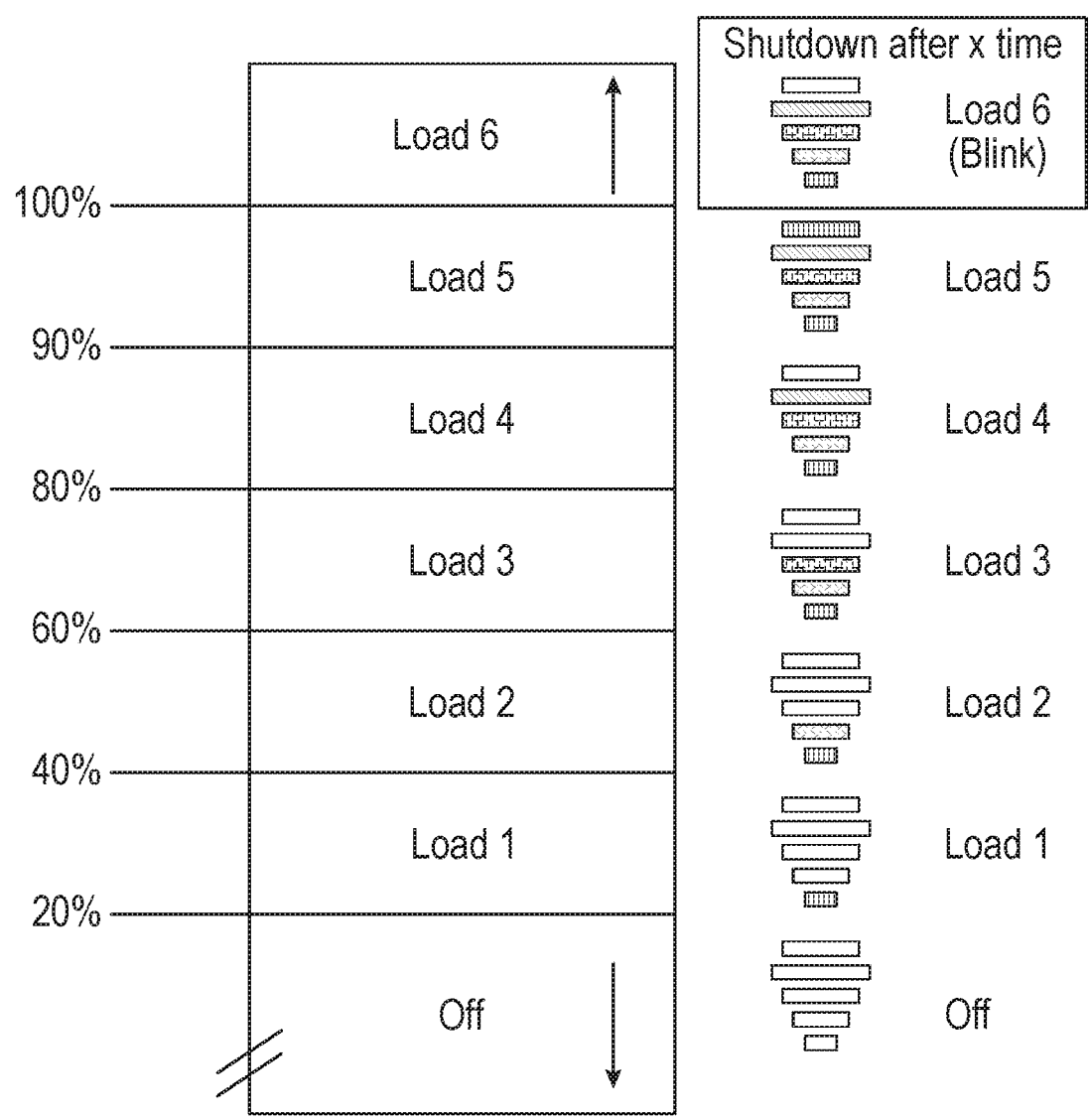
FIG. 8 is a diagram illustrating a lighting sequence of an eco-indicator of FIG. 3.

The method 90 also includes providing, with the electronic processor 62 and the eco-indicator 30, an indication corresponding to the system performance level (at block 100). In one embodiment, a look-up table may be stored in the memory 64 that maps the performance level to indication. For example, "performance level 1" corresponds to all LED bars 38, 40, 42, 44, and 46 being turned OFF. "Performance level 2" corresponds to LED bar 38 being turned ON, while the LED bars 40, 42, 44, and 46 are turned OFF. Similarly, "performance levels 3-6" correspond to progressively turning ON LED bars 38, 40, 42, 44, and 46 in sequence. "Performance level 7" corresponds to the LED bars 38, 40, 42, 44, and 46 blinking to indicate to the user that the core drill 10 is operating above the maximum allowable system performance and will shut down after a predetermined amount of time. FIG. 8 illustrates a lighting sequence of the LED bars 38, 40, 42, 44, and 46 as described above with respect to method 90. The electronic processor 62 provides control signals to the LED bars 38, 40, 42, 44, and 46 based on the indication corresponding to the system performance level. After providing the indication, the method 90 returns to detecting the next instance of one or more parameters and repeats the block 94, 96, 98, and 100 until an input is detected to deactivate the motor 68 (e.g., releasing the trigger 26).

User perception of an operation may be distorted for high-power battery-operated tools. The eco-indicator 30 allows the core drill 10 to coach a user to efficient use of the core drill 10. For example, a user may not be pushing the core drill 10 hard enough on the workpiece resulting in slower than normal completion of a work operation (e.g., drilling a core from a concrete surface). In another example, the user may be pushing the core drill 10 too hard on the workpiece, resulting in faster than normal discharge of the battery pack 20. The eco-indicators 30 allow the user to determine the optimal amount of the force to apply to the workpiece such that the core drill 10 can operate in an optimal performance level (e.g., level 4). Thereby, the user may reduce power consumption of the battery and/or speed-up completion of a workpiece operation based on the eco-indicator 30.

To provide user coaching, the eco-indicators 30 are laid out on a performance map. The performance map is divided into a plurality of performance regions, for example, a first performance region 102, a second performance region 104, and a third performance region 106. The performance map segments the plurality of LED bars 38, 40, 42, 44, and 46 into the plurality of performance regions 102, 104, and 106. For example, the first two LED bars 38 and 40 are provided in the first performance region 102, the second two LED bars 42 and 44 are provided in the second performance region 104, and the LED bar 46 is provided in the third performance region 106. When a user operates the tool, the LED bars 38, 40, 42, 44, and 46 are illuminated based on the system performance of the core drill 10. When the LED bars 42 and 44 are illuminated in the second performance region 104, the user will be aware that the core drill 10 is at optimal performance. Accordingly, the user is coached to achieve and maintain optimal performance of the core drill 10. Further, the LED bars 38, 40, 42, 44, and 46 may be colored differently to provide further system performance indications to the user. For example, the LED bars 42 and 44 in the second performance region may be colored green to indicate optimal performance, the LED bars 38, 40, and 46 in the first and third performance region may be colored yellow or red to indicate sub-optimal performance.

In some embodiments, the eco-indicators 30 may also be used on non-motorized tools, for example, work lights. In this application, the eco-indicators 30 may be used for selecting a good balance between battery life and brightness. The eco-indictors 30 may similarly be used on any device where a user has an option to change settings or operations that influence battery life or performance of the device.

Rather than deactivating the motor 68 after a predetermined amount of time operating above the maximum current level, or the maximum allowable system performance, the electronic processor 62 may reduce the power provided to the motor 68 to thereby provide an audible and/or tactile indication to the user to reduce the applied force on the core drill 10 during a coring operation. An excessive input force exerted on the core drill 10 may cause a resistive force impeding further operation of the core drill 10. For example, if the core drill 10 is pushed too fast or too hard during a coring operation (into concrete, for example), the increased reaction torque exerted on the core bit would require excess current to be drawn by the motor 68 to maintain its rotational speed. Because of the relatively high amount of power available from the battery pack 20, without an artificial "bog-down" of the motor 68, the core drill 10 does not innately provide motor bog-down feedback to the user. Such feedback can be sensed (e.g., felt and heard) by a user, and is a helpful indication that an excessive input, which may potentially damage the core drill 10, has been encountered. Excessive loading of the core drill 10 causes the motor 68 to draw excess current from the battery pack 20, which may cause quick and potentially detrimental depletion of the battery pack 20.

Accordingly, in some embodiments, the core drill 10 includes a simulated bog-down feature to provide an indication to the user that excessive loading of the core drill 10 is occurring during operation. That is, in addition to the eco-indicator 30 providing a visual indication that the core drill 10 is operating at beyond maximum capacity, the core drill 10 may also simulate bog-down of the motor 68 to provide additional haptic feedback to the user. When the electronic processor 62 determines that the current level or performance level is greater than the threshold, the electronic processor 62 controls the inverter bridge 66 to simulate bog-down in response to determining that the current level or performance level is greater than the threshold. In some embodiments, the electronic processor 62 controls the inverter bridge 66 to decrease the speed of the motor 68 to a non-zero value. For example, the electronic processor 62 reduces a duty cycle of the PWM signal provided to the FETs of the inverter bridge 66. In some embodiments, the reduction in the duty cycle (i.e., the speed of the motor 68) is proportional to an amount that the current level or performance level is above the threshold (i.e., an amount of excessive load). In other words, the more excessive the load applied to the core drill 10, the further the speed of the motor 68 is reduced by the electronic processor 62. For example, in some embodiments, the electronic processor 62 determines the difference between the current level or performance level of the motor 68 and the current threshold or performance threshold to determine a difference value. Then, the electronic processor 62 determines the amount of reduction in the duty cycle based on the difference value (e.g., using a look-up table).

Various features of the invention are set forth in the following claims.

What is claimed is:

1. A power tool comprising:
   a battery pack;
   one or more sensors;
   an indicator including a plurality of Light Emitting Diode (LED) bars;
   an electronic processor coupled to the battery pack, the one or more sensors, and the indicator and configured to:
   detect, using the one or more sensors, one or more parameters of the power tool,
   determine a system performance based on the one or more parameters,
   determine a system performance level based on the system performance, and
   provide, using the indicator, an indication corresponding to the system performance; and
   a user interface upon which the plurality of LED bars are located, wherein the user interface includes a performance map provided in addition to the plurality of LED bars and segmenting the plurality of LED bars into a plurality of different performance regions for operating the power tool, wherein the LED bars are illuminated based on the system performance level.

2. The power tool of claim 1, wherein the one or more sensors includes a current sensor to detect a tool current.

3. The power tool of claim 2, further comprising a motor powered by the battery pack, wherein the tool current is the current drawn by the motor from the battery pack.

4. The power tool of claim 3, wherein the electronic processor is further configured to:
   determine that the tool current exceeds a maximum current threshold; and
   simulate bog-down of the motor in response to determining that the tool current exceeds the maximum current threshold.

5. The power tool of claim 4, wherein simulating bog-down of the motor includes reducing the speed of the motor to a non-zero value.

6. The power tool of claim 1, wherein the electronic processor is further configured to:
   determine that the system performance is at a first system performance level when the system performance does not satisfy a first system performance threshold; and
   control the plurality of LED bars to turn OFF.

7. The power tool of claim 6, wherein the electronic processor is further configured to:
   determine that the system performance is at a second system performance level when the system performance satisfies the first system performance threshold and does not satisfy a second system performance threshold;
   control a first LED bar of the plurality of LED bars to turn ON; and
   control a second LED bar of the plurality of LED bars to turn OFF.

8. The power tool of claim 7, wherein the electronic processor is further configured to:
   determine that the system performance is at a maximum system performance level when the system performance satisfies a maximum system performance threshold; and
   control the plurality of LED bars to turn ON.

9. The power tool of claim 8, wherein the electronic processor is further configured to flash the plurality of LED bars between an ON state and an OFF state in response to the system performance satisfying the maximum system performance threshold.

10. The power tool of claim 8, wherein the electronic processor is further configured to deactivate the power tool after a predetermined period of time following the system performance satisfying the maximum system performance threshold.

11. The power tool of claim 8, wherein the first LED bar is in a first performance region of the performance map, and wherein the second LED bar is in a second performance region of the performance map.

12. The power tool of claim 8, wherein the electronic processor is further configured to:
   determine a state of charge of the battery pack; and
   update the first system performance threshold, the second system performance threshold, and the maximum system performance threshold based on the state of charge of the battery pack.

13. The power tool of claim 1, wherein the user interface further comprises:
   a center indicator to indicate a rotational axis of an output shaft of the power tool;
   a direction indicator to indicate to a user a direction to tilt the power tool; and
   a battery meter to indicate a state of charge of the battery pack.

14. The power tool of claim 13, wherein the direction indicator includes four directional arrows on four sides of the center indicator.

15. The power tool of claim 1, wherein the battery pack includes a nominal voltage between 60 Volts and 90 Volts.

16. A method for indicating performance of a power tool, the method comprising:
   detecting, using an electronic processor with one or more sensor, one or more parameters of the power tool;
   determining, using the electronic processor, a system performance based on the one or more parameters;
   determining, using the electronic processor, a system performance level based on the system performance;
   providing, using the electronic processor with an indicator, an indication corresponding to the system performance level, wherein the indicator includes a plurality of Light Emitting Diode (LED) bars; and
   illuminating the LED bars based on the system performance level, wherein the plurality of LED bars are located upon a user interface of the power tool, wherein the user interface includes a performance map provided in addition to the plurality of LED bars and segmenting the plurality of LED bars into a plurality of different performance regions for operating the power tool.

17. The method of claim 16, wherein the one or more sensors includes a current sensor to detect a tool current.

18. The method of claim 17, wherein the tool current is the current drawn by a motor of the power tool from a battery pack of the power tool.

19. The method of claim 18, further comprising:
   determining that the tool current exceeds a maximum current threshold; and
   simulating bog-down of the motor in response to determining that the tool current exceeds the maximum current threshold.

20. The method of claim 19, wherein simulating bog-down of the motor includes reducing the speed of the motor to a non-zero value.

21. The method of claim 16, further comprising:
   determining that the system performance is at a first system performance level when the system performance does not satisfy a first system performance threshold; and
   controlling the plurality of LED bars to turn OFF.

22. The method of claim 21, further comprising:
   determining that the system performance is at a second system performance level when the system performance satisfies the first system performance threshold and does not satisfy a second system performance threshold;
   controlling a first LED bar of the plurality of LED bars to turn ON; and
   controlling a second LED bar of the plurality of LED bars to turn OFF.

23. The method of claim 22, further comprising:
   determining that the system performance is at a maximum system performance level when the system performance satisfies a maximum system performance threshold; and
   controlling the plurality of LED bars to turn ON.

24. The method of claim 23, further comprising flashing the plurality of LED bars between an ON state and an OFF state in response to the system performance satisfying the maximum system performance threshold.

25. The method of claim 23, further comprising deactivating the power tool after a predetermined period of time following the system performance satisfying the maximum system performance threshold.

26. The method of claim 16, wherein the first LED bar is in a first performance region of the performance map, and wherein the second LED bar is in a second performance region of the performance map.

27. The method of claim 23, further comprising:
determining a state of charge of the battery pack; and
updating the first system performance threshold, the second system performance threshold, and the maximum system performance threshold based on the state of charge of the battery pack.

28. A method for indicating performance of a power tool, the method comprising:
detecting, using an electronic processor with one or more sensor, one or more parameters of the power tool;
determining, using the electronic processor, a system performance based on the one or more parameters;
determining, using the electronic processor, a system performance level based on the system performance;
providing, using the electronic processor with an indicator, an indication corresponding to the system performance level, wherein the indicator includes a plurality of Light Emitting Diode (LED) bars;
illuminating the LED bars based on the system performance level, wherein the plurality of LED bars are located upon a user interface of the power tool, wherein the user interface includes a performance map provided in addition to the plurality of LED bars and segmenting the plurality of LED bars into a plurality of different performance regions for operating the power tool;
determining that the system performance satisfies a maximum system performance threshold; and
simulating bog-down of a motor of the power tool in response to determining that the system performance exceeds the maximum system performance threshold, wherein simulating bog-down of the motor includes reducing the speed of the motor to a non-zero value.

* * * * *